(12) United States Patent
Cheng et al.

(10) Patent No.: US 12,255,211 B2
(45) Date of Patent: Mar. 18, 2025

(54) ARRAY SUBSTRATE AND MANUFACTURING METHOD THEREOF, AND DISPLAY APPARATUS

(71) Applicants: Hefei BOE Display Technology Co., Ltd., Anhui (CN); BOE Technology Group Co., Ltd., Beijing (CN)

(72) Inventors: Min Cheng, Beijing (CN); Ke Dai, Beijing (CN); Haipeng Yang, Beijing (CN); Maoxiu Zhou, Beijing (CN); Jiaqing Liu, Beijing (CN); Xipeng Wang, Beijing (CN)

(73) Assignees: Hefei BOE Display Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/908,226

(22) PCT Filed: Oct. 15, 2021

(86) PCT No.: PCT/CN2021/124071
§ 371 (c)(1),
(2) Date: Aug. 30, 2022

(87) PCT Pub. No.: WO2023/060547
PCT Pub. Date: Apr. 20, 2023

(65) Prior Publication Data
US 2024/0213272 A1 Jun. 27, 2024

(51) Int. Cl.
*H01L 27/12* (2006.01)
*G02F 1/1362* (2006.01)
*G02F 1/1368* (2006.01)

(52) U.S. Cl.
CPC .... *H01L 27/1244* (2013.01); *G02F 1/136209* (2013.01); *G02F 1/136295* (2021.01); *G02F 1/1368* (2013.01)

(58) Field of Classification Search
CPC ......... G02F 1/136286; G02F 1/134363; G02F 1/134372
See application file for complete search history.

(56) References Cited

U.S. PATENT DOCUMENTS 6,188,459 B1 * 2/2001 Kim ................. G02F 1/134363
349/141
2006/0028603 A1 * 2/2006 Lee ................. G02F 1/136209
349/141
(Continued)

FOREIGN PATENT DOCUMENTS

CN 106681064 A * 5/2017 ....... G02F 1/133514

*Primary Examiner* — Alexander P Gross
(74) *Attorney, Agent, or Firm* — Ling Wu; Stephen Yang; Ling and Yang Intellectual Property

(57) ABSTRACT

The present disclosure provides an array substrate and a manufacturing method thereof, and a display apparatus. The array substrate includes a plurality of gate lines (20) and a plurality of data lines (50) disposed on a base substrate (11), the plurality of gate lines (20) extend along a first direction, the plurality of data lines (50) extend in a second direction, the plurality of gate lines (20) and the plurality of data lines (50) are intersected to define a plurality of sub-pixels, the sub-pixel includes a thin film transistor (10), a pixel electrode (80) and a common electrode (90), the common electrode (90) in one sub-pixel is connected with the common electrode (90) in the adjacent sub-pixel through a common connection portion (110).

20 Claims, 8 Drawing Sheets

(56) References Cited

U.S. PATENT DOCUMENTS

| | | | |
|---|---|---|---|
| 2013/0033654 A1* | 2/2013 | Kim | G02F 1/136209 349/143 |
| 2014/0226101 A1* | 8/2014 | Kim | G02F 1/13306 349/43 |
| 2018/0188625 A1* | 7/2018 | Tian | G02F 1/134309 |
| 2019/0025660 A1* | 1/2019 | Shimoshikiryoh | G02F 1/136286 |
| 2019/0027497 A1* | 1/2019 | Long | G02F 1/134363 |
| 2019/0064607 A1* | 2/2019 | Cheng | H01L 27/124 |

* cited by examiner

ARRAY SUBSTRATE AND MANUFACTURING METHOD THEREOF, AND DISPLAY APPARATUS

CROSS-REFERENCE TO RELATED APPLICATION

The present application is a U.S. National Phase Entry of International Application No. PCT/CN2021/124071 having an international filing date of Oct. 15, 2021. The above-identified application is hereby incorporated by reference.

TECHNICAL FIELD

The present disclosure relates to, but is not limited to, the field of display technologies, and particularly to an array substrate and a manufacturing method thereof, and a display apparatus.

BACKGROUND

Liquid Crystal Display (LCD) has advantages such as small size, low power consumption and no radiation, and has developed rapidly. A liquid crystal display panel includes a Thin Film Transistor (TFT) array substrate and a Color Filter (CF) substrate that are cell-assembled, and Liquid Crystal (LC) molecules are provided between the array substrate and the color filter substrate. By controlling a common electrode and a pixel electrode, an electric field is formed to drive the liquid crystal to deflect, thereby implementing gray scale display.

SUMMARY

The following is a summary of subject matters described herein in detail. This summary is not intended to limit the scope of protection of claims.

In one aspect, the present disclosure provides an array substrate, including a plurality of gate lines and a plurality of data lines disposed on the base substrate. The plurality of gate lines extend along a first direction and are sequentially arranged in a second direction. The plurality of data lines extend along the second direction and are sequentially arranged in the first direction. The plurality of gate lines and the plurality of data lines are intersected to define a plurality of sub-pixels, and a sub-pixel at least includes a thin film transistor, a pixel electrode and a common electrode. The first direction intersects the second direction. A common electrode in at least one sub-pixel is connected with a common electrode in an adjacent sub-pixel in the second direction through a common connection portion. An orthographic projection of the common connection portion on the base substrate and an orthographic projection of the gate line on the base substrate have a first overlapped region, and the first overlapped region have a first width in the first direction and a second width in the second direction, wherein the first width is less than the second width.

In an exemplary implementation, the first width is 10% to 20% of the second width.

In an exemplary implementation, the first width is 5 μm to 8 μm.

In an exemplary implementation, a pixel electrode in at least one sub-pixel at least includes a pixel base portion and a pixel pectination portion, and the pixel pectination portion includes a plurality of pixel strip electrodes disposed at a side of the pixel base portion away from the gate line; a common electrode in at least one sub-pixel at least includes a common base portion and a common pectination portion, the common pectination portion includes a plurality of common strip electrodes disposed at a side of the common base portion close to the gate line; first ends of the plurality of pixel strip electrodes are connected with the pixel base portion, and second ends of the plurality of pixel strip electrodes extend in a direction towards the common base portion; first ends of the plurality of common strip electrodes are connected with the common base portion, and second ends of the plurality of common strip electrodes extend in a direction towards the pixel base portion; in the first direction, the pixel strip electrodes and the common strip electrodes are alternately arranged.

In an exemplary implementation, the pixel electrode in at least one sub-pixel further includes a pixel connection portion disposed at a side of the pixel base portion close to the gate line and connected with a drain electrode of the thin film transistor through a via; a first distance between an edge of the pixel connection portion at a side close to the common connection portion and an edge of the common connection portion at a side close to the pixel connection portion is between 20 μm and 50 μm, and the first distance is a dimension in the first direction.

In an exemplary implementation, the common electrode in at least one sub-pixel further includes a common shielding portion, and the common shielding portion of the present sub-pixel is connected with the common base portion in the next row of sub-pixels through the common connection portion.

In an exemplary implementation, there is a second distance between an edge of the common base portion in the present sub-pixel at a side away from the previous row of sub-pixels and an edge of the gate line in the previous row of sub-pixels at a side close to the present sub-pixel. There is a third distance between an end of the pixel strip electrode close to the common base portion and an edge of the common base portion close to the pixel strip electrode. The second distance is greater than the third distance, the second distance and the third distance are dimensions in the second direction.

In an exemplary implementation, the second distance is 5 μm to 7 μm.

In an exemplary implementation, the third distance is 3.5 μm to 4.5 μm.

In an exemplary implementation, a fourth distance between an end of the pixel pectination portion in the present sub-pixel close to the gate line in the previous row of sub-pixels and an edge of the gate line in the previous row sub-pixels at a side close to the pixel pectination portion in the present sub-pixel is 9.0 μm to 11.5 μm.

In an exemplary implementation, the first substrate further includes a black matrix shielding region, and an orthographic projection of the black matrix shielding region on the base substrate contains an orthographic projection of the gate lines and the data lines on the base substrate; in the second direction, a fifth distance between a first edge of the black matrix shielding region at a side close to the gate line and an edge of the gate line at a side close to the first edge is 5 μm to 7 μm.

In an exemplary implementation, at least one sub-pixel further includes a common electrode line extending along the first direction, and the common electrode is connected with the common electrode line through a via.

In an exemplary implementation, at least one sub-pixel further includes a common connection line extending along the second direction, and the common electrode is simultaneously connected with the common electrode line and the common connection line through a via.

In an exemplary implementation, at least one sub-pixel further includes at least one shielding line, a first end of the shielding line is connected with the common electrode line, and a second end of the shielding line extends in a direction away from the common electrode line.

In an exemplary implementation, at least one sub-pixel further includes a gate connection line extending along the second direction, and the gate connection line is connected with the gate line.

In an exemplary implementation, at least one sub-pixel further includes a gate connection electrodes, which is connected with the gate connection line and the gate line through a via, respectively.

On the other hand, the present disclosure further provides a display apparatus including a first substrate and a second substrate arranged oppositely. The first substrate includes the array substrate as described above, the second substrate at least includes a black matrix. An orthographic projection of the black matrix on the base substrate contains an orthographic projection of the gate lines and the data lines on the base substrate; in the second direction, a fifth distance between a first edge of the black matrix at a side close to the gate line and an edge of the gate line at a side close to the first edge is 5 µm to 7 µm.

In another aspect, the present disclosure further provides a method for manufacturing an array substrate, including:

Forming a plurality of gate lines and a plurality of data lines on the base substrate, wherein the plurality of gate lines extend along the first direction and are sequentially arranged in the second direction, the plurality of data lines extend along the second direction and are sequentially arranged in the first direction, the plurality of gate lines and the plurality of data lines are intersected to define a plurality of sub-pixels, a sub-pixel at least includes a thin film transistor, the first direction intersects the second direction;

Forming a pixel electrode and a common electrode, wherein a common electrode in at least one sub-pixel is connected with a common electrode in an adjacent sub-pixel in the second direction through a common connection portion, an orthographic projection of the common connection portion on the base substrate and an orthographic projection of the gate line on the base substrate have a first overlapped region, the first overlapped region have a first width in the first direction and a second width in the second direction, and the first width is less than the second width.

After the accompanying drawings and detailed descriptions are read and understood, other aspects may be understood.

BRIEF DESCRIPTION OF DRAWINGS

The accompanying drawings are used for providing understanding for the technical solutions of the present disclosure, and form a part of the specification. They are used for explaining the technical solutions of the present disclosure together with the embodiments of the present disclosure, and do not form a limitation on the technical solutions of the present disclosure.

DESCRIPTION OF REFERENCE SIGNS

Figure 1:
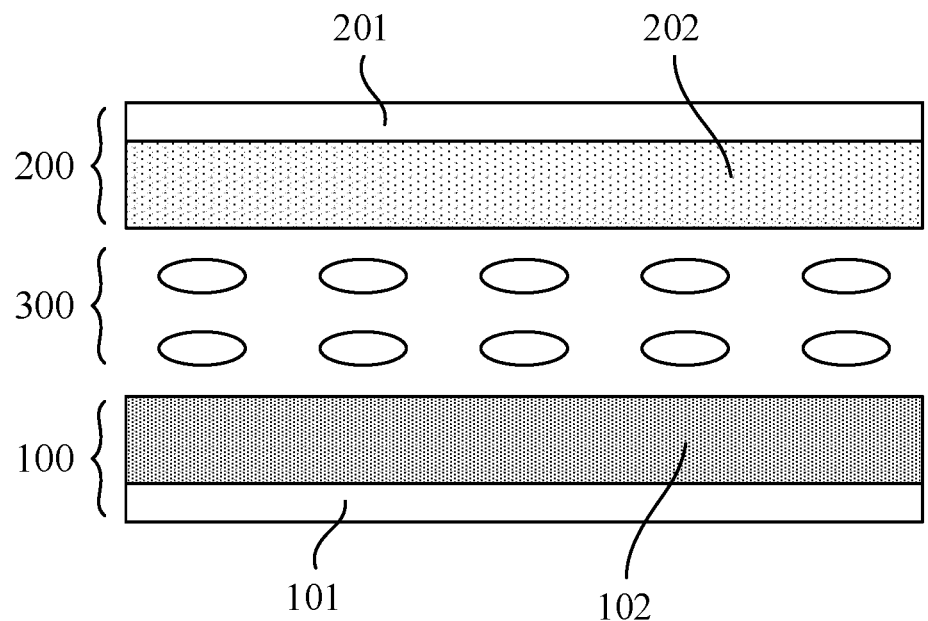
FIG. 1 is a schematic sectional view of a display apparatus.

10—thin film transistor; 11—base substrate; 12—active layer;
13—source electrode; 14—drain electrode; 15—first insulation layer;
16—second insulation layer; 20—gate line; 21—opening;
22—gate protrusion; 30—common electrode line; 31—groove;
32—common protrusion; 40—shielding line; 50—data line;
60—gate connection line; 70—common connection line; 80—pixel electrode;
81—pixel base portion; 82—pixel pectination portion; 83—pixel connection portion;
90—common electrode; 91—common base portion; 92—common pectination portion;
93—common shielding portion; 100—first substrate; 101—first base substrate;
102—first structural layer; 110—common connection portion; 120—gate connection electrode;
200—second substrate; 201—second base substrate; 202—second structural layer;
300—liquid crystal layer; 400—black matrix.

DETAILED DESCRIPTION

To make purposes, technical solutions, and advantages of the present disclosure clearer, the embodiments of the present disclosure will be described in detail with reference to the accompanying drawings. It is to be noted that implementations may be implemented in multiple different forms. Those of ordinary skills in the art may easily understand such a fact that implementation modes and contents may be transformed into various forms without departing from the purpose and scope of the present disclosure. Therefore, the present disclosure should not be interpreted as being limited to the contents recorded in the following implementations only. The embodiments in the present disclosure and features in the embodiments can be arbitrarily combined with each other if there are no conflicts.

Scales of the drawings in the present disclosure may be used as a reference in the actual process, but are not limited thereto. For example, a width-length ratio of a channel, thickness and spacing of various film layer, and width and spacing of various signal line may be adjusted according to actual needs. The quantity of pixels in the array substrate and the quantity of sub-pixels in each pixel are not limited to the quantities shown in the drawings. The drawings described in the present disclosure are schematic structural diagrams only, and one implementation mode of the present disclosure is not limited to the shapes, numerical values or the like shown in the drawings.

Ordinal numerals such as "first", "second", and "third" in the specification are set to avoid confusion of constituent elements, but are not intended to limit in terms of quantity.

In the specification, for convenience, wordings indicating orientation or positional relationships, such as "center", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements may be changed as appropriate according to directions according to which the constituent elements are described. Therefore, the positional relationships are not limited to the words and phrases used in the specification, and appropriate substitutions may be made according to situations.

In the specification, unless otherwise specified and defined explicitly, terms "mount", "mutually connect", and "connect" should be understood in a broad sense. For example, it may be a fixed connection, or a detachable connection, or an integrated connection. It may be a mechanical connection or an electrical connection. It may be a direct mutual connection, or an indirect connection through middleware, or internal communication between two elements. Those of ordinary skills in the art may understand specific meanings of these terms in the present disclosure according to specific situations.

In the present specification, a transistor refers to a component which at least includes three terminals, i.e., a gate electrode, a drain electrode and a source electrode. The transistor has a channel region between the drain electrode (drain electrode terminal, drain region, or drain) and the source electrode (source electrode terminal, source region, or source), and a current may flow through the drain electrode, the channel region, and the source electrode. It is to be noted that, in the specification, the channel region refers to a region through which the current mainly flows.

In the specification, a first electrode may be the drain electrode, and a second electrode may be the source electrode. Or, the first electrode may be the source electrode, and the second electrode may be the drain electrode. In cases that transistors with opposite polarities are used, a current direction changes during operation of a circuit, or the like, functions of the "source electrode" and the "drain electrode" are sometimes interchangeable. Therefore, the "source electrode" and the "drain electrode", as well as the "source terminal" and the "drain terminal" are interchangeable in the specification.

In the specification, "electrical connection" includes a case that constituent elements are connected together through an element with a certain electrical effect. The "element with the certain electrical effect" is not particularly limited as long as electrical signals may be sent and received between the connected constituent elements. Examples of the "element with the certain electrical effect" not only include electrodes and wirings, but also include switch elements such as transistors, resistors, inductors, capacitors, other elements with various functions, etc.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is 80° or more and 100° or less, and thus also includes a state in which the angle is 85° or more and 95° or less.

In the specification, a "film" and a "layer" are interchangeable. For example, a "conductive layer" may be replaced with a "conductive film" sometimes. Similarly, an "insulation film" may be replaced with an "insulation layer" sometimes.

Triangle, rectangle, trapezoid, pentagon or hexagon in this specification is not strictly defined, and they may approximately be triangle, rectangle, trapezoid, pentagon or hexagon, etc. There may be some small deformation caused by tolerance, and there may be guide angle, arc edge and deformation, etc.

In the present disclosure, "about" refers to that a boundary is defined not so strictly and numerical values within process and measurement error ranges are allowed.

With the maturity of TFT-LCD technology, large-size and super-large-size high-resolution liquid crystal display apparatuses have been developed rapidly in recent years, also with gradually increased market share. With the increased size of LCD apparatus, defected problems such as horizontal lines and vertical lines gradually increase, which has a great impact on product quality and yield. For example, in a 65-inch full-screen liquid crystal display apparatus, there may be a defect that horizontal lines and vertical lines appear in a startup L0 state. It is found that the defect of horizontal lines and vertical lines in the startup L0 state are caused to some extent by a relatively large overlapped area between the common electrode and the black matrix. The relatively large overlapped area between the common electrode and the black matrix makes the coupling capacitance between the common electrode and the black matrix is relatively large. Upon startup, a common voltage on the common electrode changes instantaneously (such as from 0V to −8.7V), which makes the black matrix coupled and charged. Because the charged black matrix will pull the pixel electrode at the edge of the black matrix, it will lead to light leakage in L0 state, which is macroscopically manifested as horizontal lines and vertical lines upon startup. Although the use of high resistance black matrix can improve the horizontal lines and vertical lines to a certain extent, the charge of high resistance black matrix is difficult to eliminate, and once the black matrix is coupled and charged, the horizontal lines and vertical lines will be difficult to disappear.

FIG. 1 is a schematic sectional view of a display apparatus. As shown in FIG. 1, the display apparatus may include a first substrate 100 and a second substrate 200 arranged oppositely, and a liquid crystal layer 300 disposed between the first substrate 100 and the second substrate 200, the first substrate 100 may include a first structural layer 102 disposed at a side of the first base substrate 101 towards the second substrate 200, the second substrate 200 may include a second structural layer 202 disposed at a side of the second base substrate 201 towards the first substrate 100. LCD can be categorized into Twisted Nematic (TN) display mode, In Plane Switching (IPS) display mode, Fringe Field Switching (FFS) display mode and Advanced Super Dimension Switch (ADS) display mode in accordance with display mode. For the ADS display mode, in an exemplary implementation, the first structure layer 102 may include a gate line, a data line, a thin film transistor, a pixel electrode, and a common electrode, and the second structure layer 202 may include a black matrix and a filter unit.

Figure 2:
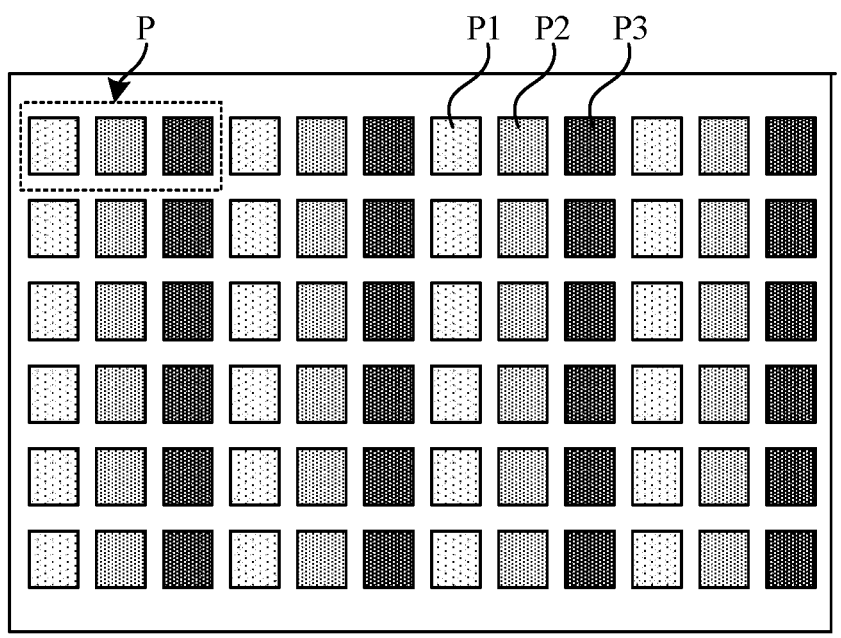
FIG. 2 is a schematic diagram of a planar structure of a display apparatus.

FIG. 2 is a schematic diagram of a planar structure of display apparatus. As shown in FIG. 2, the display apparatus may include a plurality of pixel units P arranged in a matrix, wherein at least one of the plurality of pixel units P includes a first sub-pixel P1 that emits first-color light, a second sub-pixel P2 that emits second-color light, and a third sub-pixel P3 that emits third-color light. The three sub-pixels each may include a thin film transistor, a pixel electrode and a common electrode. In an exemplary implementation, the first sub-pixel P1 may be a red sub-pixel emitting red (R) light, the second sub-pixel P2 may be a green sub-pixel emitting green (G) light, the third sub-pixel P3 may be a blue sub-pixel emitting blue (B) light, the shape of the sub-pixels in the pixel unit may be a rectangular shape, a diamond shape, a pentagonal shape, a hexagonal shape, or the like, and the sub-pixels in the pixel unit may be arranged side by side horizontally, side by side vertically, or in manner like a Chinese character "品", which is not limited in the present disclosure. In an exemplary implementation, the pixel unit may include four sub-pixels, which is not limited in the present disclosure.

Figure 3:
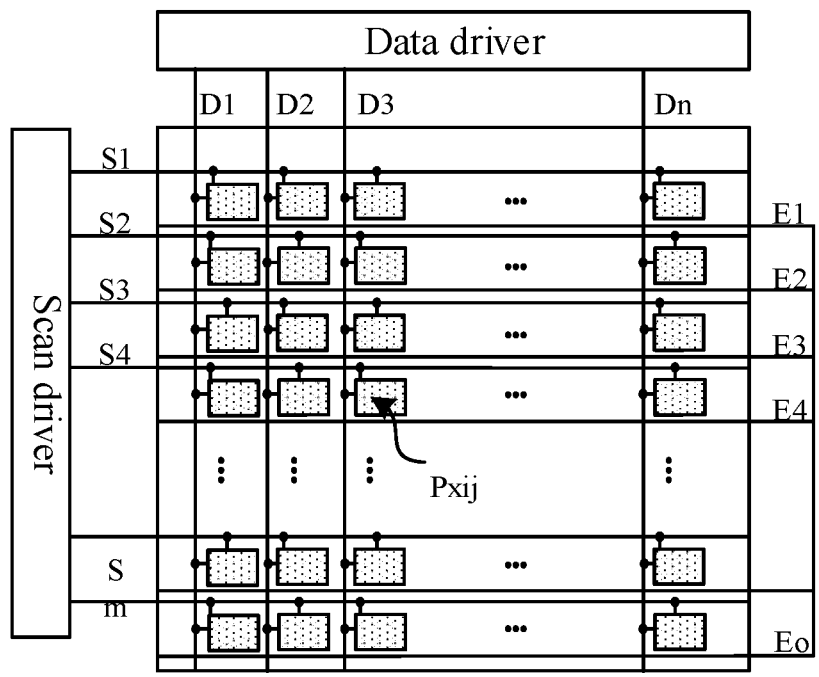
FIG. 3 is a schematic diagram of a planar structure of an array substrate.

FIG. 3 is a schematic diagram of a planar structure of an array substrate. As shown in FIG. 3, in an exemplary implementation, the array substrate includes a display region and a frame region, the display region may include a plurality of gate lines (S1 to Sm) and a plurality of data lines (D1 to Dn), wherein the plurality of gate lines may extend along a horizontal direction and be arranged sequentially along a vertical direction, the plurality of data lines may extend along the vertical direction and be arranged sequentially along the horizontal direction, and the plurality of gate lines and the plurality of data lines are intersected with each other to define a plurality of sub-pixels Pxij arranged regularly, where i and j may be natural numbers. In an exemplary implementation, at least one sub-pixel Pxij may include a thin film transistor, a pixel electrode and a common electrode, wherein the thin film transistor is connected with a gate line, a data line and a pixel electrode, respectively.

In an exemplary implementation, the array substrate may also include a plurality of common electrode lines (E1 to Eo), which may extend along the horizontal direction and are sequentially arranged along the vertical direction, and are connected correspondingly with common electrodes in the plurality of sub-pixels Pxij.

In an exemplary implementation, a plurality of gate lines are led out to the frame region and connected with the scan driver, and a plurality of data lines are led out to the frame region and connected with the data driver, at least a portion of the scan driver and the data driver may be formed on the array substrate.

In an exemplary implementation, an external control device (such as a timing controller) may provide a gray scale value and a control signal suitable for a specification of the data driver to the data driver, and the data driver may utilize the received gray scale value and the control signal to generate a data voltage to be provided to the data signal lines D1, D2, D3, . . . and Dn. For example, the data driver may sample the gray value using the clock signal and apply a data voltage corresponding to the gray value to the data signal lines D1 to Dn by taking a pixel row as a unit, wherein n may be a natural number. An external control device may provide a clock signal, a scan start signal and the like suitable for a specification of the scan driver to the scan driver, and the scan driver may utilize the clock signal, the scan start signal and the like to generate a scan signal to be provided to the scan signal lines S1, S2, S3, . . . and Sm. For example, the scan driver may provide sequentially a scan signal with a turn-on level pulse to the scan signal lines S1 to Sm, where m may be a nature number. For example, the scan driver may be constructed in a form of a shift register and may generate the scan signal by sequentially transmitting the scan start signal provided in a form of the turn-on level pulse to a next-stage circuit under the control of the clock signal.

Figure 4:
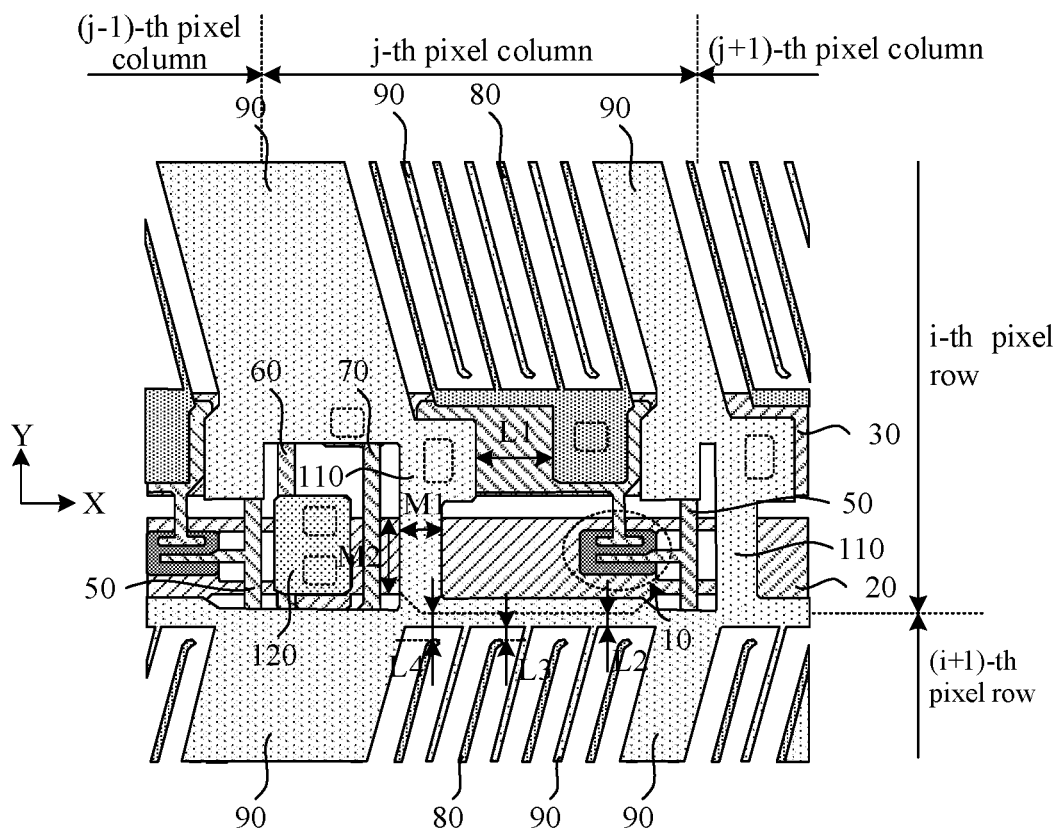
FIG. 4 is a schematic diagram of a planar structure of an array substrate according to an exemplary embodiment of the present disclosure.

FIG. 4 is a schematic diagram of a planar structure of an array substrate according to an exemplary embodiment of the present disclosure. In an exemplary implementation, the array substrate may include a plurality of gate lines 20, a plurality of common electrode lines 30 and a plurality of data lines 50 disposed on the base substrate. The gate line 20 and the common electrode line 30 may extend along a first direction X, a plurality of gate lines 20 and a plurality of common electrode lines 30 may be respectively disposed in sequence along a second direction Y. The data line 50 may extend along the second direction Y, and a plurality of data lines 50 may be sequentially disposed along the first direction X. A plurality of gate lines 20 and a plurality of data lines 50 are intersected with each other to define a plurality of sub-pixels arranged regularly, and the first direction X is intersected with the second direction X. In an exemplary implementation, a plurality of sub-pixels may form a plurality of pixel rows and a plurality of pixel columns. One pixel row may include a plurality of sub-pixels spaced along the first direction X, a plurality of pixel rows may be spaced along the second direction Y. One pixel column may include a plurality of sub-pixels spaced along the second direction Y, and a plurality of pixel columns may be spaced along the first direction X. FIG. 4 mainly shows a lower region of a sub-pixel of j-th column and i-th row and an upper region of a sub-pixel of j-th column and (i+1)-th row to illustrate a structure of one sub-pixel. In the following description, a present sub-pixel generally refers to a sub-pixel of i-th row and j-th column, a previous row of sub-pixel generally refers to a sub-pixel of (i−1)-th row and j-th column, and a next row of sub-pixel generally refers to a sub-pixel of (i+1)-th row and j-th column.

In an exemplary implementation, at least one sub-pixel may at least include a thin film transistor 10, a pixel electrode 80 and a common electrode 90. The thin film transistor 10 may be connected with the gate line 20, the data line 50, and the pixel electrode 80, respectively. The common electrode 90 may be connected with the common electrode line 30, and the thin film transistor 10 is configured to, under the control of the gate line 20, receive a data voltage transmitted by the data line 50 and output it to the pixel electrode 80, and control an electric field formed between the pixel electrode 80 and the common electrode 90 to drive a deflection of the liquid crystal, thereby implementing a gray scale display.

Figure 5:
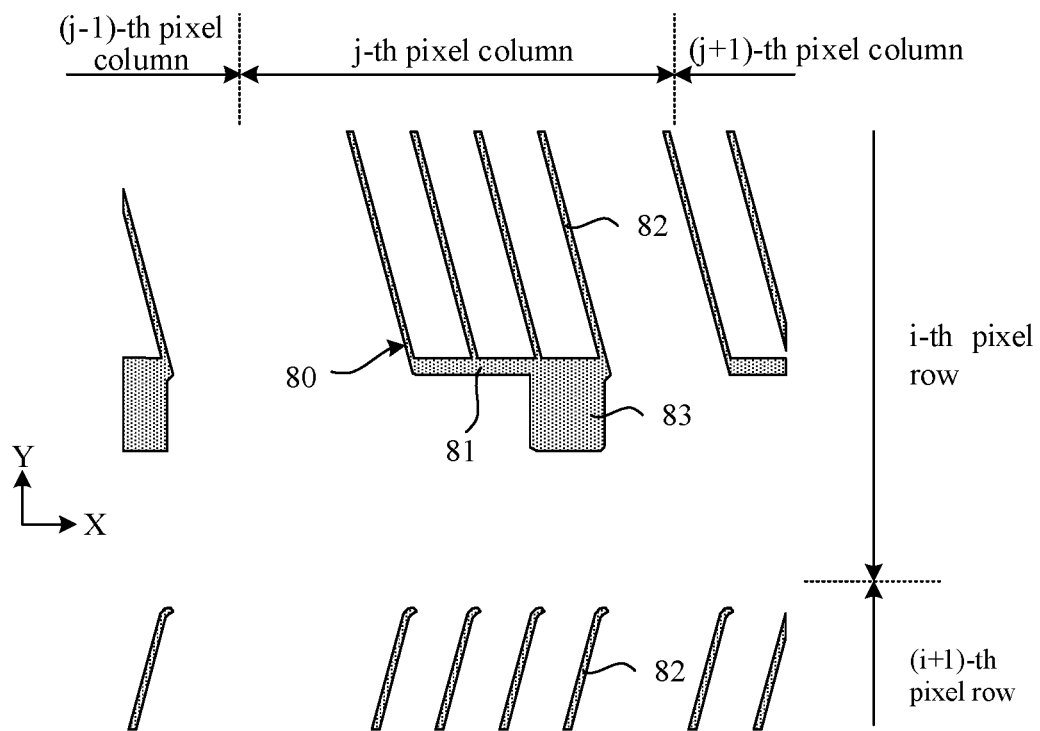
FIG. 5 is a schematic diagram of a planar structure of a pixel electrode in FIG. 4.

FIG. 5 is a schematic diagram of a planar structure of a pixel electrode in FIG. 4. As shown in FIG. 4 and FIG. 5, in an exemplary implementation, the pixel electrode 80 in the present sub-pixel may include at least a pixel base portion 81, a pixel pectination portion 82 and a pixel connection portion 83 connected with each other. The pixel base portion 81 may be a strip shape extending along the first direction X and may be located in a lower region of the present sub-pixel (a region close to the next row of sub-pixels). The pixel pectination portion 82 may include a plurality of pixel strip electrodes spaced along the first direction X, disposed at a side of the pixel base portion 81 away from the gate line 20, and extending in a direction away from the gate line 20. The pixel connection portion 83 may be disposed at a side of the pixel base portion 81 close to the gate line 20, and connected with the drain electrode of the thin film transistor 10 through a via.

Figure 6:
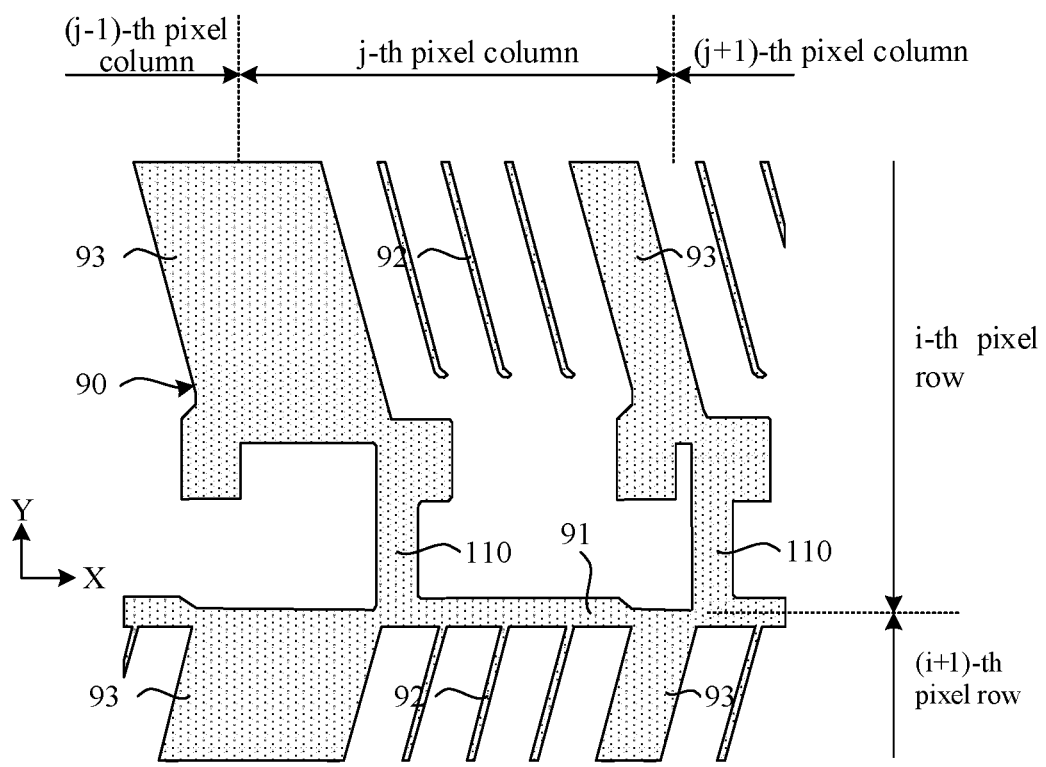
FIG. 6 is a schematic diagram of a planar structure of a common electrode in FIG. 4.

FIG. 6 is a schematic diagram of a planar structure of a common electrode in FIG. 4. As shown in FIG. 4 and FIG. 6, in an exemplary implementation, the common electrode 90 in the present sub-pixel may at least include a common base portion 91, a common pectination portion 92 and a common shielding portion 93 connected with each other. The common base portion 91 may be a strip shape extending along the first direction X, may be located in the upper region of the present sub-pixel (the region close to the previous row of sub-pixels). The common pectination portion 92 may include a plurality of common strip electrodes spaced along the first direction X, disposed at a side of the common base portion 91 close to the gate line 20, and extending in a direction close to the gate line 20, and the common shielding portion 93 may be located at one side or both sides of the common pectination portion 92 in the first direction X.

In an exemplary implementation, the present sub-pixel may also include a common connection portion 110 configured to connect a common electrode 90 in adjacent sub-pixels in the second direction Y. For example, the common shielding portion 93 in the previous row of sub-pixels may be connected with the common base portion 91 in the present sub-pixel through the common connection portion 110. For another example, the common shielding portion 93 in the present sub-pixel may be connected with the common base portion 91 in the next row of sub-pixels through the common connection portion 110.

In an exemplary implementation, it is noted that the common electrode 90 of the present sub-pixel include the common base portion 91, the common pectination portion 92, the common shielding portion 93 and the common connection portion 110 which are connected with each other to form an integrated structure, and the common electrodes 90 in adjacent sub-pixels in the second direction Y are formed into an integrated structure connected with each other.

In an exemplary implementation, an orthographic projection of the common connection portion 110 in the present sub-pixel on the base substrate and an orthographic projection of the gate line 20 in the present sub-pixel on the base substrate have a first overlapped region. The first overlapped region has a first width M1 in the first direction X and a second width M2 in the second direction Y. In an exemplary implementation, the first width M1 is less than the second width M2.

In an exemplary implementation, the first width M1 of the first overlapped region may be a width of the common connection portion 110 in the first direction X, the second width M2 may be a width of the gate line 20 in the second direction Y, and the first width M1 may be about 10% to 20% of the second width M2. For example, the first width M1 may be about 15% of the second width M2.

In an exemplary implementation, the first width M1 may be about 5 μm to 8 μm, and the second width M2 may be about 30 μm to 50 μm.

In an exemplary implementation, a first distance L1 between an edge of the pixel connection portion 83 in the present sub-pixel at a side close to the common connection portion 110 and an edge of the common connection portion 110 in the present sub-pixel at a side close to the pixel connection portion 83 may be about 20 μm to 50 μm, and the first distance L1 may be a dimension in the first direction X.

In an exemplary implementation, a second distance L2 between an edge of the common base portion 91 in the present sub-pixel at a side away from the previous row of sub-pixels and an edge of the gate line 20 in the previous row of sub-pixels at a side close to the present sub-pixel may be about 5 μm to 7 μm. Alternatively, a second distance L2 between an edge of the common base portion 91 in the next row of sub-pixels at a side away from the present sub-pixel and an edge of the gate line 20 in the present sub-pixel at a side close to the next row of sub-pixels may be about 5 μm to 7 μm, and the second distance L2 may be a dimension in the second direction Y.

In an exemplary implementation, a third distance L3 between an end of the pixel pectination 82 in the present sub-pixel close to the common base portion 91 and an edge of the common base portion 91 in the present sub-pixel at a side close to the pixel pectination 82 may be about 3.5 μm to 4.5 μm, and the third distance L3 may be a dimension in the second direction Y. In an exemplary implementation, the second distance L2 may be greater than the third distance L3.

In an exemplary implementation, a fourth distance L4 between an end of the pixel pectination portion 82 in the present sub-pixel close to the gate line 20 in the previous row of sub-pixels and an edge of the gate line 20 in the previous row of sub-pixels at a side close to the pixel pectination portion 82 in the present sub-pixel may be about 9.0 μm to 11.5 μm. Alternatively, a fourth distance L4 between an end of the pixel pectination portion 82 in the next row of sub-pixels close to the gate line 20 in the present sub-pixel and an edge of the gate line 20 in the present sub-pixel close to the pixel pectination portion 82 in the next row of sub-pixels may be about 9.0 μm to 11.5 μm, and the fourth distance L4 may be a dimension in the second direction Y.

In an exemplary implementation, the common electrode line 30 in the present sub-pixel may be disposed at a side of the gate line 20 away from the next row of sub-pixels and the common electrode line 30 is connected with the common electrode 90 in the present sub-pixel through a via.

In an exemplary implementation, at least one sub-pixel may include a common connection line 70. The common connection line 70 may extend along the second direction Y, and the common electrode 90 of the present sub-pixel may be simultaneously connected with the common electrode line 30 and the common connection line 70 through a via.

In an exemplary implementation, at least one sub-pixel may include a gate connection line 60. The gate connection line 60 may extend along the second direction Y and may be connected with the gate line 20.

In an exemplary implementation, at least one sub-pixel may include a gate connection electrode 120 which may be connected with the gate line 20 and the gate connection line 60 through a via, respectively.

In an exemplary implementation, at least one sub-pixel may include at least one shielding line, a first end of the shielding line is connected with the common electrode line, and a second end of the shielding line extends in a direction away from the gate line 20 and the common electrode line 30.

In an exemplary implementation, the shielding line may be located at at least one side of the data line 50.

In an exemplary implementation, the shielding wire may be located at at least one side of the common connection line 70.

In an exemplary implementation, the gate line 20, the common electrode line 30 and the shielding line may be arranged on the same layer and formed simultaneously by the same patterning process.

In an exemplary implementation, the data line 50, the gate connection line 60 and the common connection line 70 may be arranged on the same layer and formed simultaneously by the same patterning process.

In an exemplary implementation, the pixel electrode 80, the common electrode 90 and the gate connection electrode 120 may be arranged on the same layer and formed simultaneously by the same patterning process.

Exemplary description is made below through a process of manufacturing an array substrate. A "patterning process" mentioned in the present disclosure includes coating with a photoresist, mask exposure, development, etching, photoresist stripping, and other treatments for a metal material, an inorganic material, or a transparent conductive material, and includes coating with an organic material, mask exposure, development, and other treatments for an organic material. The deposition may be any one or more of sputtering, evaporation, and chemical vapor deposition. The coating may be any one or more of spray coating, spin coating, and ink-jet printing. The etching may be any one or more of dry etching and wet etching, which is not limited in present disclosure. A "thin film" refers to a layer of thin film made of a certain material on a base substrate through a process such as depositing, coating, or the like. If the "thin film" does not need a patterning process in an entire preparation process, the "thin film" may also be called a "layer". If the "thin film" needs a patterning process in the entire preparation process, it is called a "thin film" before the patterning process, and called a "layer" after the patterning process. The "layer" processed by the patterning processes includes at least one "pattern". "A and B being arranged on the same layer" in the present disclosure means that A and B are formed simultaneously through a same patterning process, and the "thickness" of a film layer is dimension of the film layer in a direction perpendicular to the array substrate. In an exemplary embodiment of the present disclosure, "an orthographic projection of B is within a range of an orthographic projection of A" or "an orthographic projection of A includes an orthographic projection of B" refers to that a boundary of the orthographic projection of B falls within a range of a boundary of the orthographic projection of A, or the boundary of the orthographic projection of A is overlapped with the boundary of the orthographic projection of B.

In an exemplary implementation, by taking a lower region of a sub-pixel of i-th row and j-th column and an upper region of a sub-pixel of (i+1)-th row and j-th column as an example, the manufacturing for the array substrate may include the following operations.

Figure 7:
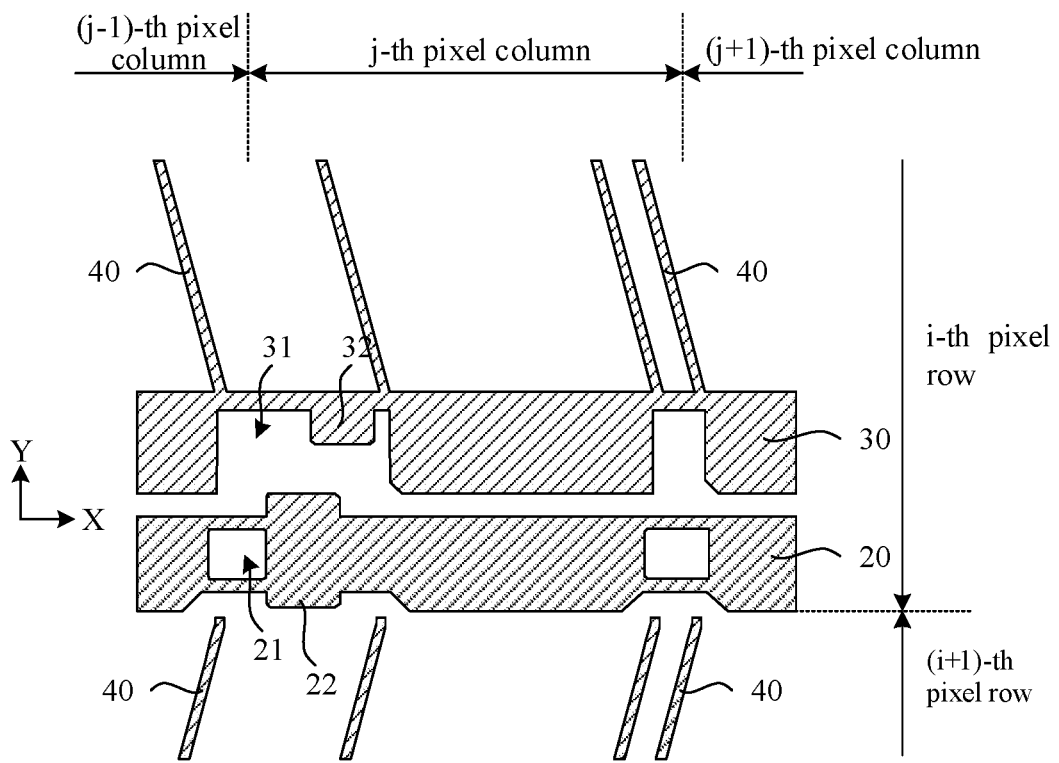
FIG. 7 is a schematic diagram of an array substrate after a pattern of a first conductive layer is formed according to the present disclosure.

(1) Forming a pattern of a first conductive layer. In an exemplary implementation, forming the pattern of the first conductive layer may include: depositing a first conductive thin film on a base substrate, and patterning the first conductive thin film by a patterning process, to form the pattern of the first conductive layer on the base substrate 10, wherein the pattern of the first conductive layer at least includes a gate line 20, a first common electrode line 30, and a shielding line 40, as shown in FIG. 7.

In an exemplary implementation, the gate line 20 and the common electrode line 30 may be in a straight line shape of which a body portion extends along the first direction X, the gate line 20 of each sub-pixel may be disposed at a lower side of the sub-pixel (a side of the sub-pixel close to the next row of sub-pixels), the common electrode line 30 may be disposed at a side of the gate line 20 away from the next row of sub-pixels, and the body portion of the common electrode line 30 may be parallel to the body portion of the gate line 20.

In an exemplary implementation, the gate line 20 and the common electrode line 30 may be provided with equal width or non-equal width, and the width refers to dimensions perpendicular to the extending direction (second direction Y) of the gate line 20 or the common electrode line 30.

In an exemplary implementation, at least one opening 21 may be disposed on the gate line 20. The opening 21 may be provided in a region where the gate line 20 is overlapped with a data line formed subsequently. A width of the gate line 20 in the region where the opening 21 is located may be less than the widths of the gate line 20 in other regions, so as to reduce an overlapped area between the gate line 20 and the data line formed subsequently, which is equivalent to a width reduction design of the gate line 20 in the overlapped region between the gate line 20 and the data line, so as to reduce a parasitic capacitance between the gate line 20 and the data line and improve an electrical performance of the display panel.

In an exemplary implementation, at least one gate protrusion 22 may be disposed on the gate line 20, and the gate protrusion 22 may be disposed in an region where the gate line 20 is overlapped with a gate connection line subsequently formed, which is equivalent to a width increase design of the gate line 20 in the overlapped region with the gate connection line, to facilitate the connection between the gate connection line and the gate line 20 through the gate connection electrode.

In an exemplary implementation, at least one groove 31 may be disposed at a side of the common electrode line 30 close to the gate line 20. The groove 31 may be disposed in an region where the common electrode line 30 is overlapped with the data line formed subsequently, so as to reduce an overlapped area between the common electrode line 30 and the data line formed subsequently, which is equivalent to a width reduction design of common electrode line 30 in the overlapped region with the data line, therefore, the parasitic capacitance between the common electrode line 30 and the data line may be reduced, and the electrical performance of the display panel may be improved.

In an exemplary implementation, at least one common protrusion 32 may be disposed within at least one groove 31, and the common protrusion 32 may be disposed in an region where the common electrode line 30 is overlapped with the common connection line subsequently formed, to facilitate the connection of the common electrode line 30 and the common connection line through a via.

In an exemplary implementation, a plurality of shielding lines 40 may be disposed at a side of the common electrode line 30 away from the gate line 20, a first end of the plurality of shielding lines 40 is connected with the common electrode line 30, and a second end of the plurality of shielding lines 40 extends in a direction away from the gate line 20 and the common electrode line 30.

In an exemplary implementation, the extending direction of the plurality of shielding lines 40 may be the same as the extending direction of the data lines formed subsequently, so that the shielding line 40 may be disposed at one side or both sides of the data line in the first direction X, respectively, thus achieving shielding the data line by the shielding lines 40 to improve the electrical performance of the display panel.

In an exemplary implementation, the extending direction of the shielding line 40 in the present sub-pixel and the extending direction of the shielding line 40 in the next row of sub-pixels may be mirror-symmetrical with respect to the first direction X, and the extending direction of the shielding line 40 in the previous row of sub-pixels and the extending direction of the shielding line 40 in the present sub-pixel may be mirror-symmetrical with respect to the first direction X.

Figure 8:
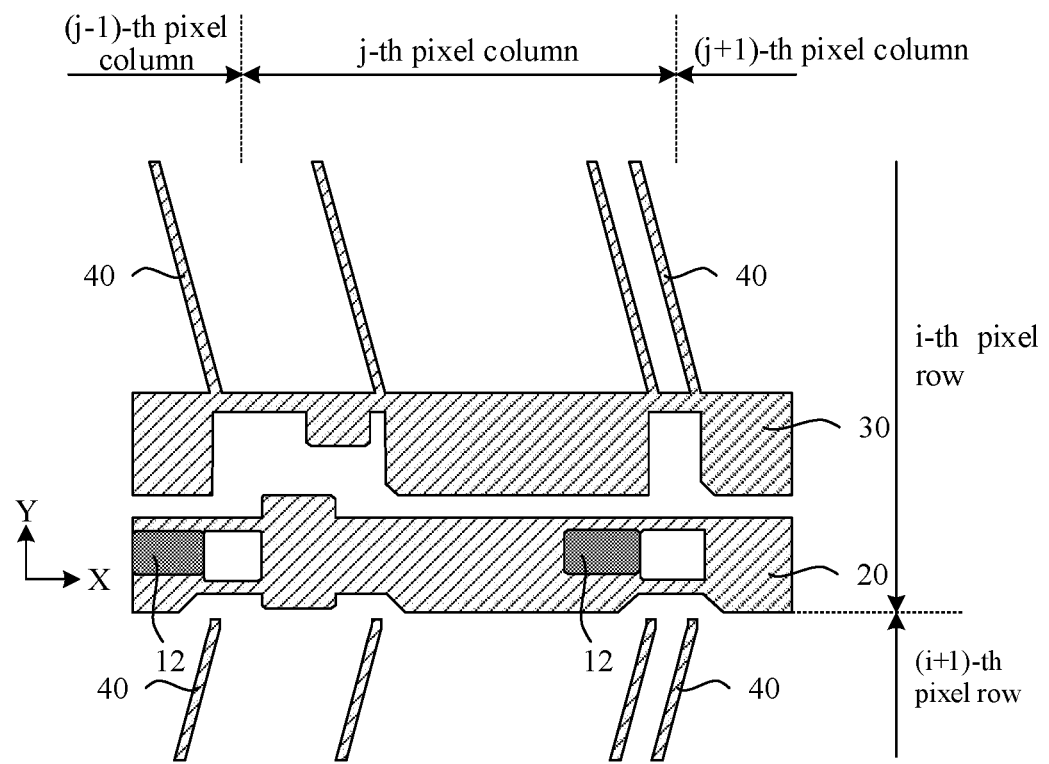
FIG. 8 is a schematic diagram of an array substrate after a pattern of a semiconductor layer is formed according to the present disclosure.

(2) Forming a pattern of a semiconductor layer. In an exemplary implementation, forming the pattern of the semiconductor layer may include: on the base substrate where the aforementioned patterns are formed, sequentially depositing a first insulation thin film and a semiconductor layer thin film, and patterning the semiconductor layer thin film through a patterning process to form a first insulation layer covering the pattern of the first conductive layer and a pattern of a first semiconductor layer disposed on a first insulation layer, wherein the pattern of the semiconductor layer at least includes an active layer disposed within each sub-pixel, as shown in FIG. 8.

In an exemplary implementation, the shape and position of an active layer 12 within each sub-pixel may be the same, and the structure of the thin film transistor may be simplified.

In an exemplary implementation, an orthographic projection of the active layer 12 on the base substrate may be located within a range of an orthographic projection of the gate line 20 on the base substrate, and the overlapped region of the gate line 20 and the active layer 12 may serve as a gate electrode for each sub-pixel.

Figure 9:
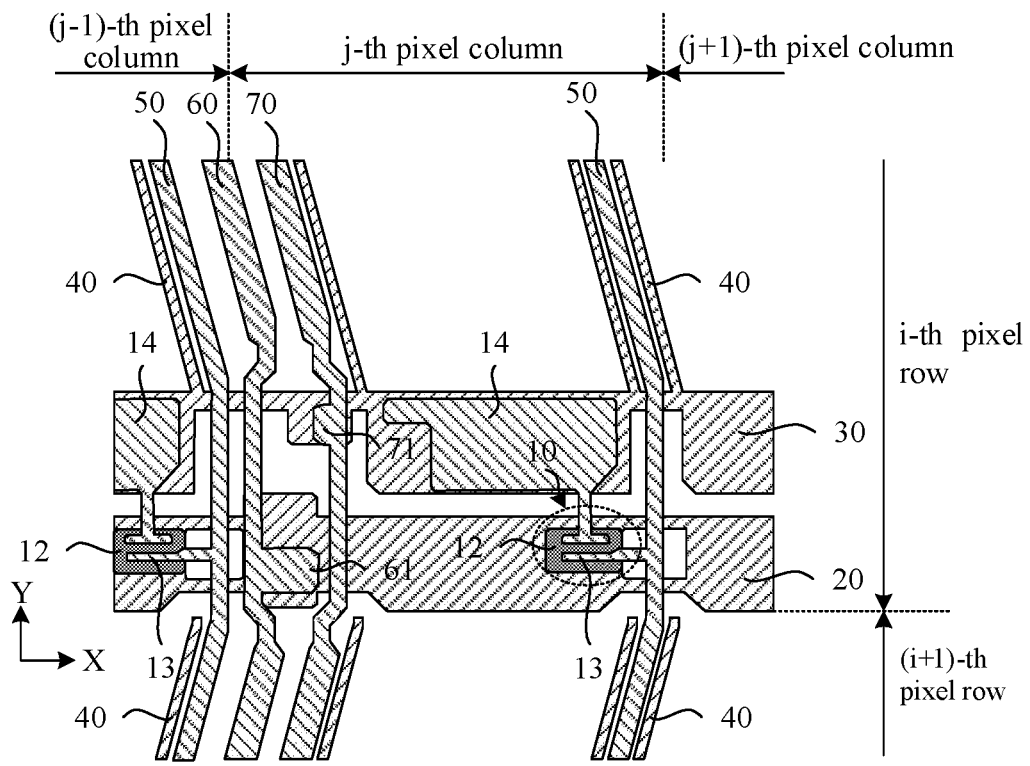
FIG. 9 is a schematic diagram of an array substrate after a pattern of a second conductive layer is formed according to the present disclosure.

(3) Forming a pattern of a second conductive layer. In an exemplary implementation, forming the pattern of the second conductive layer may include: on the base substrate formed with aforementioned pattern, depositing a second conductive thin film, and patterning the second conductive thin film by a patterning process, to form the pattern of the second conductive layer, wherein the pattern of the second conductive layer at least includes a data line 50, a gate connection line 60, common connection line 70, a source electrode 13 and a drain electrode 14, as shown in FIG. 9.

In an exemplary implementation, the data line 50, the gate connection line 60, and the common connection line 70 may be in the shape of a bended line of which a body portion extends along the second direction Y, and the extending directions of each of the bended lines of the data line 50, the gate connection line 60, and the common connection line 70 may be substantially same.

In an exemplary implementation, the data line 50 may be disposed at one side (right side) of the sub-pixel in the first direction X, the gate connection line 60 may be disposed at the opposite side (left side) of the sub-pixel in the first direction X, and the common connection line 70 may be disposed at one side of the gate connection line 60 in the first direction X. In an exemplary implementation, the data line 50 may be disposed in each sub-pixel, and the gate connection line 60 and the common connection line 70 may be disposed in some sub-pixels, that is, some sub-pixels is only provided with the data line 50, and other sub-pixels are provided with the data line 50, the gate connection line 60 and the common connection line 70. The data line 50 is configured to be connected with a thin film transistor in the sub-pixel to provide a data signal to the thin film transistor. The gate connection line 60 is configured to be connected with the gate line 20 in the sub-pixel to provide a gate drive signal to the gate line 20. The common connection line 70 is configured to be connected with the common electrode line 30 in the sub-pixel, so that a plurality of common electrode lines 30 extending along the first direction X and a plurality of common connection lines 70 extending along the second direction Y form a grid-like common grid line, thereby improving uniformity of the common electrode of the display panel.

In an exemplary implementation, the data line 50, the gate connection line 60, and the common connection line 70 may be provided with equal width or non-equal width, and the width refers to a dimension perpendicular to the extending direction of the data line 50, the gate connection line 60, or the common connection line 70.

In an exemplary implementation, at least one gate connection protrusion 61 may be disposed at a side of the gate connection line 60 towards the common connection line 70, and an orthographic projection of the gate connection protrusion 61 on the base substrate is at least partially overlapped with an orthographic projection of the gate protrusion 22 on the gate line 20 on the base substrate to facilitate the connection of the gate connection line 70 and the gate line 20 through the connection electrode.

In an exemplary implementation, at least one common connection protrusion 71 may be disposed at a side of the common connection line 70 towards the gate connection line 60, and an orthographic projection of the common connection protrusion 71 on the base substrate is at least partially overlapped with an orthographic projection of the common protrusion 32 on the common electrode line 30 on the base substrate to facilitate the connection of the common connection Line 70 and the common electrode line 30 through a via.

In the exemplary implementation, the source electrode 13 of each sub-pixel is disposed at a side of the data line 50 in an opposite direction of the first direction X and is connected with the data line 50 to form an integral structure. The drain electrode 14 of each sub-pixel is provided individually and an orthographic projection of the drain electrode 14 on the base substrate is at least partially overlapped with an orthographic projection of the common electrode line 30 on the base substrate. One end of the source electrode 13 and one end of the drain electrode 14 are respectively disposed on the active layer 12, a conductive channel is formed between the source electrode 13 and the drain electrode 14, and the thin film transistor 10 is formed by the gate electrode, the active layer 12, the source electrode 13 and the drain electrode 14.

In an exemplary implementation, for the sub-pixels provided with the gate connection line 60 and the common connection line 70, one shielding line 40 may be disposed at a side of the data line 50 in the opposite direction of the first direction X, and the other shielding line 40 may be disposed at a side of the common connection line 70 in the first direction X, that is, the data line 50, and the gate connection line 60 and the common connection line 70 are located between the two shielding lines 40.

In an exemplary implementation, for sub-pixels in which the gate connection line 60 and the common connection line 70 are not provided, one shielding line 40 may be provided on the opposite side of the first direction X of the data line 50, and the other shielding line 40 may be provided on the side of the first direction X of the data line 50, that is, the data line 50 is located between the two shielding lines 40.

Figure 10:
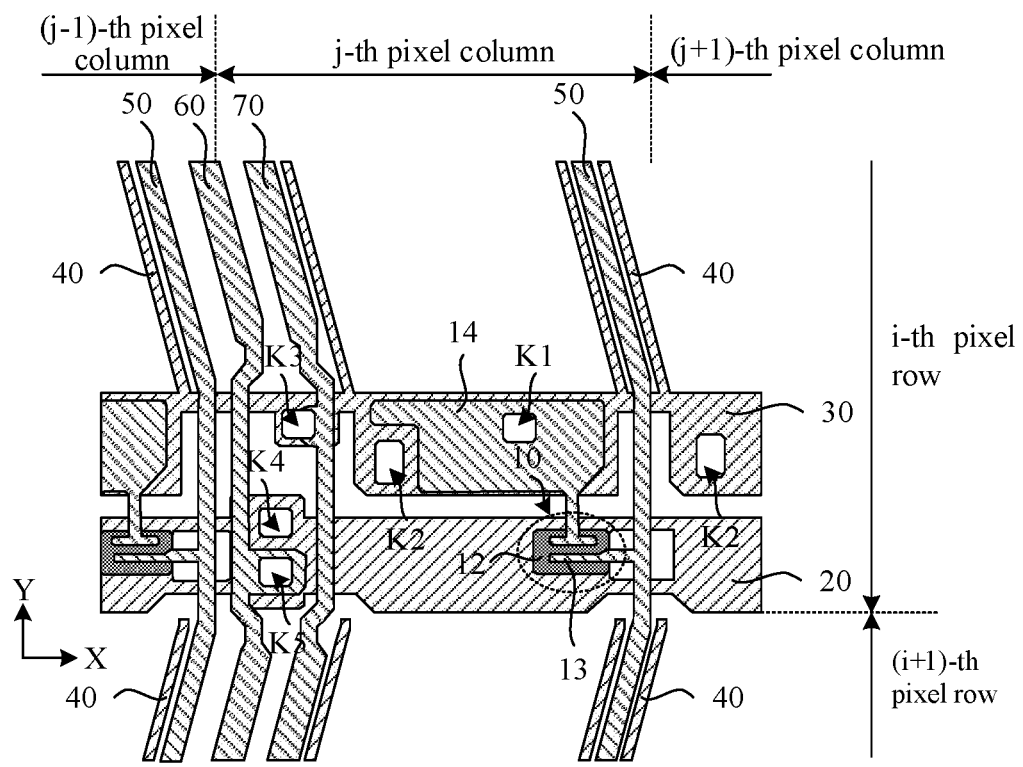
FIG. 10 is a schematic diagram of an array substrate after a pattern of a second insulation layer is formed according to the present disclosure.

(4) Forming a pattern of a second insulation layer. In an exemplary implementation, forming the pattern of the second insulation layer may include: on the base substrate formed with aforementioned patterns, depositing a second insulation thin film, and patterning the second insulation thin film by a patterning process, to form a pattern of the second insulation layer covering the second conductive pattern, wherein a plurality of vias are disposed on the pattern of the second insulation layer, as shown in FIG. 10.

In an exemplary implementation, for a sub-pixel provided with the gate connection line 60 and the common connection line 70, the plurality of vias may at least include a first via K1, a second via K2, a third via K3, a fourth via K4, and a fifth via K5. For sub-pixels without the gate connection line 60 and the common connection line 70, the plurality of vias may at least include a first via K1 and a second via K2.

In an exemplary implementation, an orthographic projection of the first via K1 on the base substrate is located within the range of the orthographic projection of the drain electrode on the base substrate, the second insulation layer in the first via K1 is etched away to expose a surface of the drain electrode 14, and the first via K1 is configured such that the pixel electrode formed subsequently is connected with the drain electrode 14 through the first via k1.

In an exemplary implementation, an orthographic projection of the second via K2 on the base substrate is located within the range of the orthographic projection of the common electrode line 30 on the base substrate, the second insulation layer and the first insulation layer in the second via K2 is etched away to expose a surface of the common electrode line 30, and the second via K2 is configured such that the common electrode formed subsequently is connected with the common electrode line 30 through the second via K2.

In an exemplary implementation, on the one hand, an orthographic projection of the third via K3 on the base substrate may be at least partially overlapped with an orthographic projection of the common connection protrusion 71 on the common connection line 70 on the base substrate, on the other hand, an orthographic projection of the third via K3 on the base substrate may be at least partially overlapped with an orthographic projection of the common protrusion 32 on the common electrode line 30 on the base substrate. The second insulation layer and the first insulation layer within the third via K3 are etched away, while exposing the surfaces of the common connection protrusion 71 and the common protrusion 32. The third via K3 is configured such that the common electrode subsequently formed is connected with the common connection protrusion 71 (common connection line 70) and the common protrusion 32 (common electrode line 30) simultaneously through the third via K3.

In an exemplary implementation, an orthographic projection of the fourth via K4 on the base substrate may be at least partially overlapped with an orthographic projection of the gate protrusion 22 on the gate line 20 on the base substrate. The second insulation layer and the first insulation layer within the fourth via K4 is etched away to expose the surface of the gate protrusion 22, and the fourth via K4 is configured such that the subsequently formed gate connection electrode is connected with the gate protrusion 22 (the gate line 20) through the fourth via K4.

In an exemplary implementation, an orthographic projection of the fifth via K5 on the base substrate may be at least partially overlapped with an orthographic projection of the gate connection protrusion 61 on the gate connection line 60 on the base substrate. The second insulation layer in the fifth via K5 is etched away to expose the surface of the gate connection protrusion 61, and the fifth via K5 is configured such that the gate connection electrode subsequently formed is connected to the gate connection protrusion 61 (gate connection line 60) through the fifth via K5.

In an exemplary implementation, a shape of the plurality of vias may include any one or more of: square, rectangle, round and ellipse.

Figure 11:
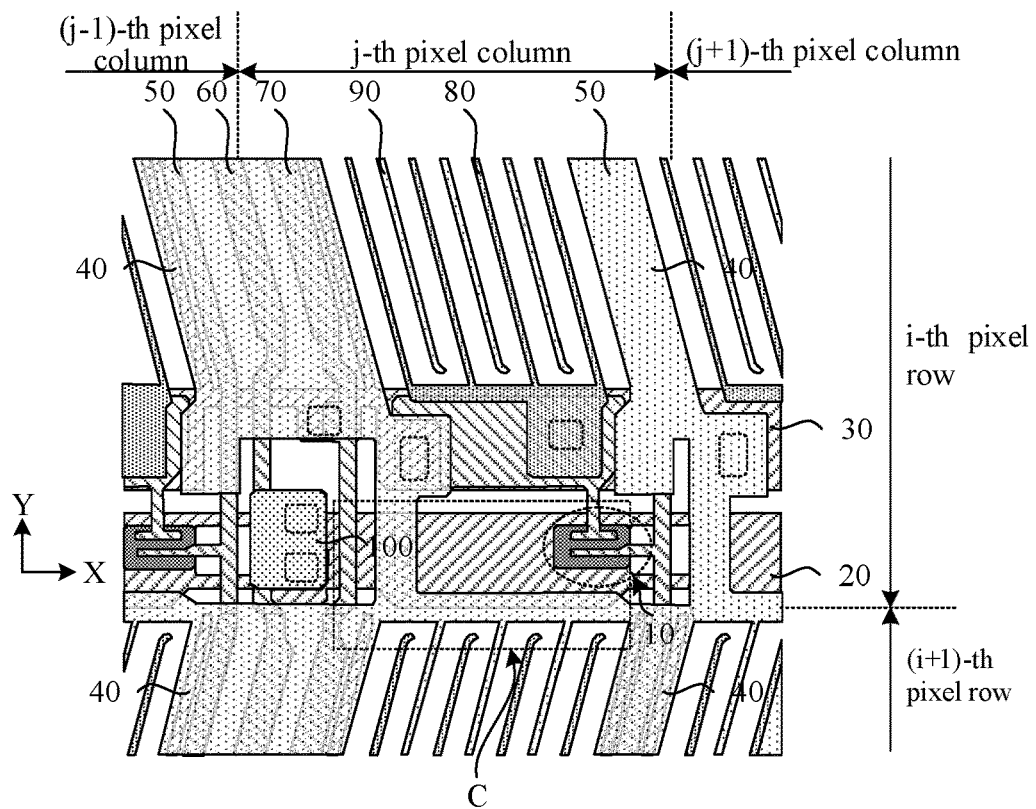
FIG. 11 is a schematic diagram of an array substrate after a pattern of a third conductive layer is formed according to the present disclosure.
Figure 12:
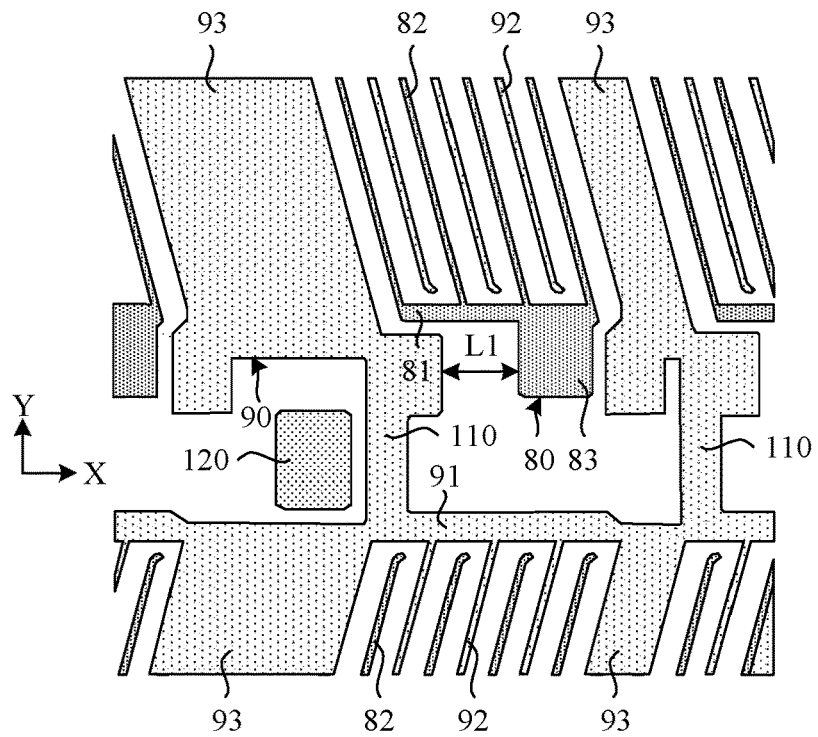
FIG. 12 is a planar view of a third conductive layer in FIG. 11.
Figure 13:
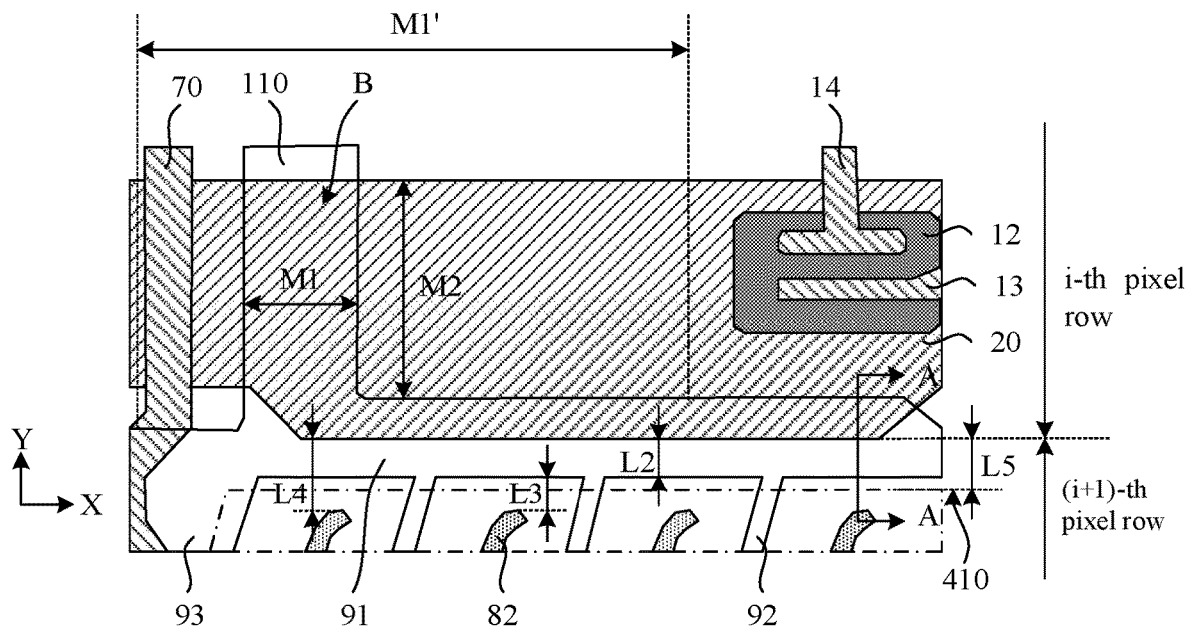
FIG. 13 is an enlarged view of a region C in FIG. 11.
Figure 14:
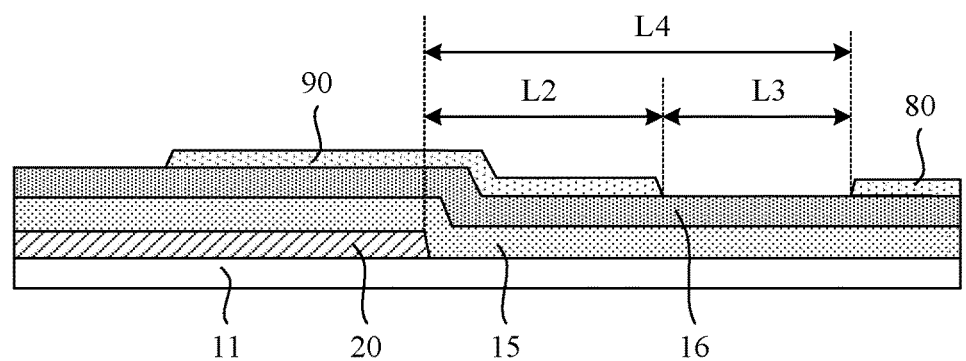
FIG. 14 is a sectional view taken along an A-A direction in FIG. 13.

(5) Forming a pattern of a third conductive layer. In an exemplary implementation, forming the pattern of the third conductive layer may include: on the base substrate formed with aforementioned patterns, depositing a third conductive film, patterning the third conductive film by a patterning process to form the pattern of the third conductive layer, wherein the pattern of the third conductive layer at least includes a pixel electrode 80, a common electrode 90, and a gate connection electrode 120, as shown in FIG. 11, FIG. 12, FIG. 13, and FIG. 14, wherein FIG. 12 is a planar view of the third conductive layer in FIG. 11, FIG. 13 is an enlarged view of a region C in FIG. 11, and FIG. 14 is a cross-sectional view in A-A direction in FIG. 13.

In an exemplary implementation, the pixel electrode 80 in the present sub-pixel may include at least a pixel base portion 81, a pixel pectination portion 82 and a pixel connection portion 83 connected with each other. The pixel base portion 81 may be a strip shape extending along the first direction X and may be located in a lower region of the present sub-pixel (a region close to the next row of sub-pixels). The pixel pectination portion 82 may include a plurality of pixel strip electrodes spaced along the first direction X, disposed at a side of the pixel base portion 81 away from the gate line 20, and first ends of the plurality of pixel strip electrodes are respectively connected with the pixel base portion 81, second ends of the plurality of pixel strip electrodes respectively extend in a direction away from the gate line 20. The pixel connection portion 83 may have a rectangular shape and may be disposed at a side of the pixel base portion 81 close to the gate line 20. An orthographic projection of the pixel connection portion 83 on the base substrate is at least partially overlapped with an orthographic projection of the drain electrode of the thin film transistor 10 on the base substrate. The pixel connection portion 83 is connected with the drain electrode of the thin film transistor 10 through the first via K1.

In an exemplary implementation, the common electrode 90 in the present sub-pixel may at least include the common base portion 91, the common pectination portion 92, the common shielding portion 93 and the common connection portion 110 which are connected with each other. The common base portion 91 may be a strip shape extending along the first direction X, located in the upper region of the present sub-pixel (the region close to the previous row of sub-pixels). The common pectination portion 92 may include a plurality of common strip electrodes spaced along the first direction X. The plurality of common strip electrodes are disposed at a side of the common base portion 91 close to the gate line 20, and first ends of the plurality of common strip electrodes are respectively connected with the common base portion 91, and the second ends of the plurality of common strip electrodes respectively extend in a direction close to the gate line 20. The common shielding portion 93 may be located on one side or both sides of the common pectination portion 92 in the first direction X and the common connection portion 110 is configured to connect the common electrodes 90 in adjacent sub-pixels in the second direction Y. For example, the common shielding portion 93 in the previous row of sub-pixels may be connected with the common base portion 91 in the present sub-pixel through the common connection portion 110. For another example, the common shielding portion 93 in the present sub-pixel may be connected with the common base portion 91 in the next row of sub-pixels through the common connection portion 110.

In an exemplary implementation, the pixel base portion 81 and the common base portion 91 may be respectively located at the upper side and lower side of the present sub-pixel. A plurality of pixel strip electrodes extend in a direction towards the common base portion 91. A plurality of common strip electrodes extend in a direction towards the pixel base portion 81. The pixel pectination portion 82 with the pectination structure and the common pectination portion 92 with the pectination structure are interposed with each other. The pixel strip electrodes and the common strip electrodes are alternately arranged in the first direction X, that is, one pixel strip electrode is located between two common strip electrodes adjacent in the first direction X, and one common strip electrode is located between two pixel strip electrodes adjacent in the first direction X, which can ensure that a horizontal electric field is formed between the pixel electrode 80 and the common electrode 90.

In an exemplary implementation, the common shielding portion 93 may be a strip shape extending along the second direction Y, and the extending direction of the common shielding portion 93 is substantially the same as the extending direction of the data line 50.

In an exemplary implementation, for a sub-pixel provided with the gate connection line 60 and the common connection line 70, the common shielding portion 93 may be connected with the common connection protrusion 71 and the common protrusion 32, respectively, through the third via K3. Thereby, it is achieved that the common electrode 90 is connected with the common electrode line 30 and the common connection line 70, respectively, so that a plurality of common electrode lines 30 extending along the first direction X and a plurality of common connection lines 70 extending along the second direction Y are connected with each other. Thus, a gridded common grid line is formed, and a common voltage is supplied to the common electrode 90 from the gridded common gird line, so that the common electrodes of all sub-pixels have the same potential, and the uniformity of the common voltage of the display panel is improved. In an exemplary implementation, an orthographic projection of the common shielding portion 93 on the base substrate is at least partially overlapped with an orthographic projection of the shielding line 40 on the base substrate, the orthographic projection of the common shielding portion 93 on the base substrate is least partially overlapped with an orthographic projection of the data line 50 on the base substrate, the orthographic projection of the common shielding portion 93 on the base substrate is at least partially overlapped with an orthographic projection of the gate connection line 60 on the base substrate, and the orthographic projection of the common shielding portion 93 on the base substrate is at least partially overlapped with an orthographic projection of the common connection line 70 on the base substrate.

In an exemplary implementation, for a sub-pixel without the gate connection line 60 and the common connection line 70, the orthographic projection of the common shielding portion 93 on the base substrate is at least partially overlapped with the orthographic projection of the shielding line 40 on the base substrate, and the orthographic projection of the common shielding portion 93 on the base substrate is at least partially overlapped with the orthographic projection of the data line 50 on the base substrate.

In an exemplary implementation, the common connection portion 110 of the present sub-pixels may have a strip shape extending along the second direction Y. A first end of the common connection portion 110 is connected with the common shielding portion 93 in the present sub-pixel, and a second end of the common connection portion 110 is connected with the common base portion 91 in the next row of sub-pixels after extending in the opposite direction of the second direction Y, so that the common electrodes 90 in adjacent sub-pixels in one pixel column are connected with each other to form an integral structure.

In an exemplary implementation, the common connection section 110 may be connected with the common electrode line 30 through the second via K2, and a common voltage is supplied to the common electrode 90 from the common electrode line 30.

In an exemplary implementation, the gate connection electrode 120 may be in the shape of a rectangle. In one aspect, an orthographic projection of the gate connection electrode 120 on the base substrate is at least partially overlapped with the orthographic projection of the gate protrusion 22 on the gate line 20 on the base substrate, and the gate connection electrode 120 is connected with the gate protrusion 22 through the fourth via K4. On the other hand, the orthographic projection of the gate connection electrode 120 on the base substrate is at least partially overlapped with the orthographic projection of the gate connection protrusion 61 on the gate connection line 60 on the base substrate, and the gate connection electrode 120 is connected with the gate connection protrusion 61 through the fifth via K5. Because the gate protrusion 22 is connected with the gate line 20, the gate connection protrusion 61 is connected with the gate connection line 60, and the gate connection electrode 120 is simultaneously connected with the gate protrusion 22 and the gate connection protrusion 61 through a via, it is achieved that the gate line 20 is connected with the gate connection line 60 through the gate connection electrode 120, and a gate drive circuit can output a gate drive signal to the gate line 20 through the gate connection line 60.

As such, manufacture of an array substrate according to an exemplary embodiment of the present disclosure is complete. Each sub-pixel includes a thin film transistor 10, a pixel electrode 80, and a common electrode 90, and the thin film transistor may include a gate electrode connected with a gate line 20, an active layer, a source electrode connected with a data line 50, a drain electrode connected with a pixel electrode 80. The common electrode 90 is connected with the common electrode line 30. The pixel electrode 80 and the common electrode 90 form a horizontal electric field.

In an exemplary implementation, the orthographic projection of the common connection 110 on the base substrate and the orthographic projection of the gate line 20 on the base substrate have a first overlapped region B. A first width M1 of the first overlapped region B may be a width of the common connection 110 in the first direction X, and a second width M2 may be a width of the gate line 20 in the second direction Y, and the first width M1 is less than the second width M2.

In an exemplary implementation, the first width M1 may be about 10% to 20% of the second width M2. For example, the first width M1 may be about 15% of the second width M2.

In an exemplary implementation, the first width M1 may be about 5 μm to 8 μm, and the second width M2 may be about 30 μm to 50 μm. For example, the first width M1 may be about 6 μm, and the second width M2 may be about 38 μm.

In an array substrate, in order to reduce the influence of the kickback voltage on the gate line 20 on the horizontal electric field, a design concept that the common electrode 90 covers the gate line 20 as much as possible is generally adopted, so that the width M1' of the common connection portion 110 in the array substrate is relatively large, about over 100 μm, as shown by the dotted line in FIG. 13. Because a region where the gate line 20 is located is the coverage region of the black matrix, there is a relatively large overlapped region between the common electrode 90 and the black matrix in the array substrate. In an exemplary implementation of the present disclosure, by reducing the first width of the common connection portion, the overlapped region between the common electrode and the black matrix is effectively reduced, the coupling capacitance between the common electrode and the black matrix is effectively reduced, the probability of coupling of the black matrix and becoming charged is reduced, light leakage in the startup L0 state is avoided, and the defect of horizontal and vertical lines is avoided in the startup L0 state. In the present disclosure, only common connection portions with necessary widths are reserved in the region where the gate line is located, compared with the existing structure, the overlapped region between the common electrode and the black matrix in the region where the gate line is located is reduced by about 80%, and the coupling capacitance between the common electrode and the black matrix is only about 20% of the existing structure, thus effectively avoiding the defect of horizontal lines and vertical lines in the startup L0 state.

In an exemplary implementation, the orthographic projection of the common connection portion 110 on the base substrate is at least partially overlapped with the orthographic projection of the drain electrode of the thin film transistor 10 on the base substrate, and the orthographic projection of the pixel connection portion 83 on the base substrate is at least partially overlapped with the orthographic projection of the drain electrode of the thin film transistor 10 on the base substrate. In a region where the pixel connection portion 83 is overlapped with the drain electrode of the thin film transistor 10, a first distance L1 between an edge of the pixel connection portion 83 at a side close to the common connection portion 110 and an edge of the common connection portion 110 in the present sub-pixel at a side close to the pixel connection portion 83 may be about 20 μm to 50 μm, and the first distance L1 may be a dimension in the first direction X. For example, the first distance L1 may be about 37.3 μm.

In an array substrate, in order to reduce the influence of the kickback voltage on the drain electrode of a thin film transistor 10 on the horizontal electric field, a design concept that the common electrode 90 covers the drain electrode of the thin film transistor 10 as much as possible is generally adopted, so that the first distance L1 between the common connection portion and the pixel connection portion in the array substrate is generally set to 5 μm to 6 μm. It is found that a small first distance L1 in the array substrate will cause short circuit between the pixel electrode and the common electrode, which will affect the process yield. In the present disclosure, by reducing the overlapped region between the common connection portion and the drain electrode of the thin film transistor 10, not only the first distance L1 is increased to 20 μm to 50 μm, but also the short circuit between the pixel electrode and the common electrode is effectively avoided, and the process yield is effectively improved. Moreover, the overlapped region between the common electrode and the black matrix is further reduced, which is more conducive to avoiding the defect of horizontal and vertical lines in the startup L0 state.

As shown in FIG. 13 and FIG. 14, the array substrate may include a base substrate 11, a gate line 20 disposed on the base substrate, a first insulation layer 15 covering the gate line 20, a second insulation layer 16 disposed on the first insulation layer 15, and a pixel electrode 80 and a common electrode 90 disposed on the second insulation layer 16. In an exemplary implementation, the orthographic projection of the common base portion 91 in the present sub-pixel on the base substrate may be at least partially overlapped with the orthographic projection of the gate line 20 in the previous row of sub-pixels on the base substrate, or the orthographic projection of the gate line 20 in the present sub-pixel on the base substrate may be at least partially overlapped with the orthographic projection of the common base portion 91 in the next row of sub-pixels on the base substrate. There is a second distance L2 between an edge of the common base portion 91 in the present sub-pixel at a side away from the previous row of sub-pixels and an edge of the gate line 20 in the previous row of sub-pixels at a side close to the present sub-pixel. Alternatively, there is a second distance L2 between an edge of the common base portion 91 in the next row of sub-pixels at a side away from the present sub-pixel and an edge of the gate line 20 in the present sub-pixel at a side close to the next row of sub-pixels. The second distance L2 may be a dimension in the second direction Y.

In an exemplary implementation, there is a third distance L3 between an end of the pixel pectination 82 in the present sub-pixel close to the common base portion 91 and an edge of the common base portion 91 in the present sub-pixel at a side close to the pixel pectination portion 82, and the third distance L3 may be a dimension in the second direction Y.

In an exemplary implementation, the second distance L2 may be greater than the third distance L3.

In an exemplary implementation, the second distance L2 may be about 5 μm to 7 μm. For example, the second distance L2 may be about 5.5 μm.

In an exemplary implementation, the third distance L3 may be about 3.5 μm to 4.5 μm. For example, the third distance L3 may be about 4.02 μm.

In an exemplary implementation, a fourth distance L4 between an end of the pixel pectination portion 82 in the present sub-pixel close to the gate line 20 in the previous row of sub-pixels and an edge of the gate line 20 in the previous row of sub-pixels at a side close to the pixel pectination portion 82 in the present sub-pixel may be about 9.0 μm to 11.5 μm. Alternatively, a fourth distance L4 between an end of the pixel pectination portion 82 in the next row of sub-pixels close to the gate line 20 in the present sub-pixel and an edge of the gate line 20 in the present sub-pixel close to the pixel pectination portion 82 in the next row of sub-pixels may be about 9.0 μm to 11.5 μm, and the fourth distance L4 may be a dimension in the second direction Y. For example, the fourth distance L4 may be about 9.52 μm.

In an exemplary implementation, the array substrate may include a black matrix shielding region. An orthographic projection of the black matrix shielding region on the base substrate at least includes orthographic projections of the thin film transistor 10, the gate line 20 and the data line 50 on the base substrate. The region in the lower dash-dot line frame in FIG. 13 is a region not shielded by the black matrix, and the region outside the dash-dot line frame is the black matrix shielding region. In an exemplary implementation, in the second direction Y, the fifth distance L5 between the first edge 410 of the black matrix shielding region at a side close to the gate line 20 and the edge of the gate line 20 at a side close to the first edge 410 may be about 5 μm to 7 μm. For example, the fifth distance L5 may be about 6 μm.

In an array substrate, in order to increase the aperture ratio as much as possible, the second distance between an edge of a common base portion and an edge of a gate line is small, and the second distance is generally less than 4 μm. It is found that due to the large abrupt change of voltage on the gate line, the abrupt change of voltage on the gate line will disturb the pixel electrode and cause light leakage at the end of the pixel strip electrode. In the present disclosure, by increasing the second distance between the edge of the common base portion and the edge of the gate line and setting the second distance to about 5 μm to 7 μm, the shielding to the gate line by the common electrode is increased, the disturbance of the abrupt voltage on the gate line to the pixel electrode is effectively avoided, not only the light leakage at the end of the pixel strip electrode is avoided effectively, but also phenomenon of the horizontal lines and vertical lines when starting up is further improved. In addition, in order to ensure the aperture ratio, the third distance between the pixel electrode and the common electrode is reduced in the present disclosure, from about 5 μm of the conventional structure to about 4 μm, not only can the fourth distance between the gate line and the pixel electrode in the present disclosure be equivalent to the conventional structure, but also the intensity of the horizontal electric field between the pixel electrode and the common electrode is increased, the ability of the horizontal electric field to resist the disturbance of the gate line signal is effectively improved, and the display quality is improved. The light leakage test shows that the existing structure has light leakage when the voltage on the gate line is −40V, while the structure in the present disclosure only has light leakage when the voltage on the gate line is −160V.

In an exemplary embodiment, the base substrate may be made of glass or quartz. The first conductive layer and the second conductive layer may be made of metal materials, such as any one or more of silver (Ag), copper (Cu), aluminum (Al) and molybdenum (Mo), or alloy materials of the above metals, such as an aluminum neodymium alloy (AlNd) or a molybdenum niobium alloy (MoNb), and may be a single-layer structure or a multi-layer composite structure, such as Mo/Cu/Mo, etc. The first conductive layer may be referred to as a gate metal (GATE) layer, the second conductive layer may be referred to as a source-drain metal (SD) layer. The third conductive layer may be made of a single-layer structure, such as indium tin oxide ITO or indium zinc oxide IZO, or may be made of a multi-layer composite structure, such as ITO/Ag/ITO, etc. The first insulation layer, the second insulation layer, the third insulation layer, and the fourth insulation layer may be made of any one or more of silicon oxide (SiOx), silicon nitride (SiNx), and silicon oxynitride (SiON), and may be single-layer, multilayers, or composite layer. The first insulation layer may be called a gate insulation (GI) layer, and the second insulation layer may be called a passivation (PVX) layer. The active layer may be made of materials such as amorphous indium gallium zinc oxide (a-IGZO), zinc oxynitride (ZnON), indium zinc tin oxide (IZTO), amorphous silicon (a-Si), polysilicon (p-Si), hexathiophene, or polythiophene, etc. That is, the present disclosure is applicable to transistors that are manufactured based on oxide technology, silicon technology or organic matter technology.

The exemplary embodiments of the present disclosure further provide a display apparatus, the display apparatus may include a first substrate and a second substrate oppositely arranged, a liquid crystal layer is disposed between the first substrate and the second substrate, and the first substrate may adopt the aforementioned array substrate, and the second substrate may include a black matrix and a filter unit.

Figure 15:
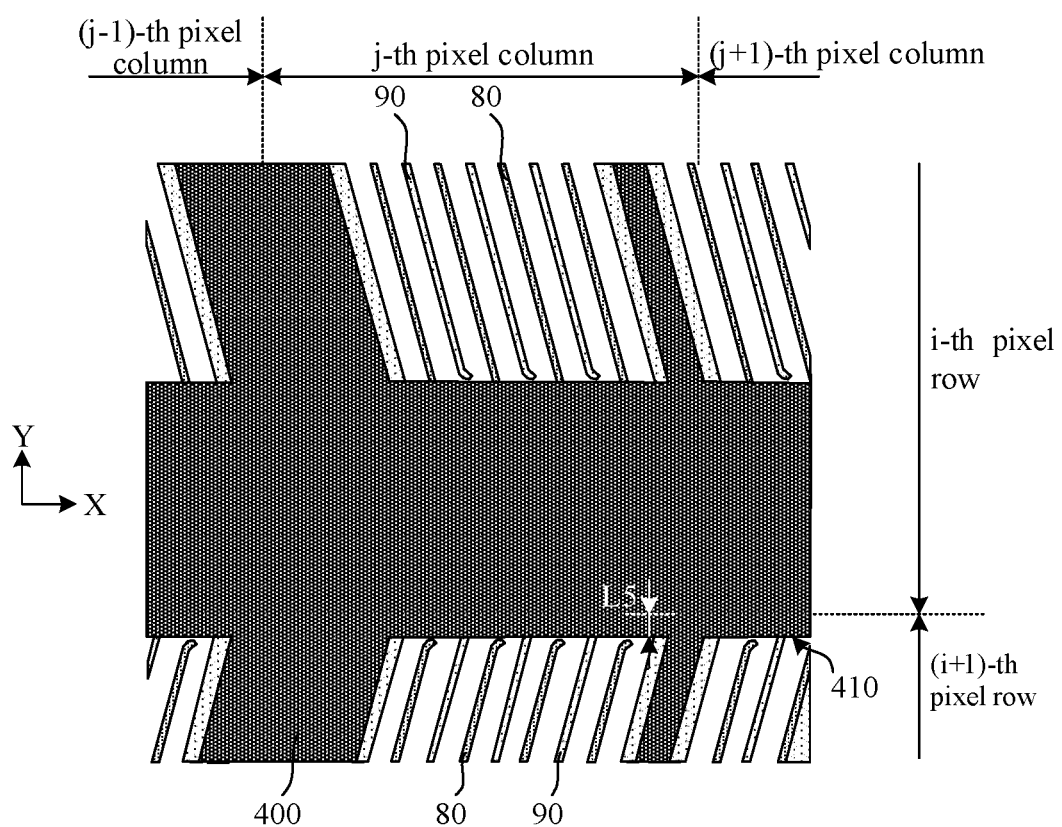
FIG. 15 is a schematic diagram of a planar structure of a display apparatus according to an exemplary embodiment of the present disclosure.

FIG. 15 is a schematic diagram of a planar structure of a display apparatus according to an exemplary embodiment of the present disclosure, illustrating a planar positional relationship between a black matrix on the second substrate and a related structure on the first substrate. As shown in FIG. 15, an orthographic projection of the black matrix 400 on the base substrate contains orthographic projections of the gate line 20, the common electrode line 30 and the data line 50 on the base substrate. In the second direction Y, the fifth distance L5 between the first edge 410 of the black matrix 400 at a side close to the gate line 20 and the edge of the gate line 20 at a side close to the first edge 410 may be about 5 μm to 7 μm. For example, the fifth distance L5 may be about 6 μm.

In an exemplary implementation, the display apparatus in the present disclosure may be any product or component with a display function, such as a mobile phone, a tablet computer, a television, a display, a notebook computer, a digital photo frame, or a navigator, and the embodiments of the present invention are not limited thereto.

The exemplary embodiments of the present disclosure further provide a method for manufacturing the array substrates provided by the aforementioned embodiments. In an exemplary implementation, the method for manufacturing the array substrate may include the followings acts:

Forming a plurality of gate lines and a plurality of data lines on the base substrate, wherein the plurality of gate lines extend along the first direction and are sequentially arranged in the second direction, the plurality of data lines extend along the second direction and are sequentially arranged in the first direction, the plurality of gate lines and the plurality of data lines are intersected to define a plurality of sub-pixels, a sub-pixel at least include a thin film transistor, the first direction intersects the second direction;

Forming a pixel electrode and a common electrode, wherein a common electrode in at least one sub-pixel is connected with a common electrode in an adjacent sub-pixel in the second direction through a common connection portion, an orthographic projection of the common connection portion on the base substrate and an orthographic projection of the gate line on the base substrate have a first overlapped region, the first overlapped region have a first width in the first direction and a second width in the second direction, and the first width is less than the second width.

Although the implementations disclosed in the present disclosure are described as above, the described contents are only implementations which are used in order to facilitate understanding of the present disclosure, and are not intended to limit the present invention. Any skilled person in the art to which the present disclosure pertains may make any modifications and alterations in forms and details of implementation without departing from the spirit and scope of the present disclosure. However, the patent protection scope of the present invention should be subject to the scope defined by the appended claims.

The invention claimed is:

1. An array substrate, comprising a plurality of gate lines and a plurality of data lines disposed on a base substrate, wherein the plurality of gate lines are extended along a first direction and are sequentially arranged in a second direction, the plurality of data lines are extended along the second direction and are sequentially arranged in the first direction, the plurality of gate lines and the plurality of data lines are intersected to define a plurality of sub-pixels, and each sub-pixel at least comprises a thin film transistor, a pixel electrode and a common electrode, the first direction is intersected with the second direction; the common electrode in at least one sub-pixel is connected with the common electrode in an adjacent sub-pixel in the second direction through a common connection portion, there is a first overlapped region between an orthographic projection of the common connection portion on the base substrate and an orthographic projection of a gate line on the base substrate, and the first overlapped region has a first width in the first direction and a second width in the second direction, wherein the first width is less than the second width;

wherein the common electrode in at least one sub-pixel at least comprises a common base portion and a common pectination portion, the common pectination portion comprises a plurality of common strip electrodes, an orthographic projection of the common base portion on the base substrate overlaps with an orthographic projection of a gate line on the base substrate.

2. The array substrate according to claim 1, wherein the first width is 10% to 20% of the second width.

3. The array substrate according to claim 2, wherein at least one sub-pixel further comprises a common electrode line extending along the first direction, and the common electrode is connected with the common electrode line through at least a via hole.

4. The array substrate according to claim 2, wherein at least one sub-pixel further comprises a gate connection line extending along the second direction, and the gate connection line is connected with the gate line.

5. The array substrate according to claim 1, wherein the first width is 5 μm to 8 μm.

6. The array substrate according to claim 1, wherein the pixel electrode in at least one sub-pixel at least comprises a pixel base portion and a pixel pectination portion, and the pixel pectination portion comprises a plurality of pixel strip electrodes disposed at a side of the pixel base portion away from the gate line; the plurality of common strip electrodes are disposed at a side of the common base portion close to the gate line; first ends of the plurality of pixel strip electrodes are connected with the pixel base portion, and second ends of the plurality of pixel strip electrodes extend in a direction towards the common base portion; first ends of the plurality of common strip electrodes are connected with the common base portion, and second ends of the plurality of common strip electrodes extend in a direction towards the pixel base portion; in the first direction, the pixel strip electrodes and the common strip electrodes are alternately arranged.

7. The array substrate according to claim 6, wherein the pixel electrode in at least one sub-pixel further comprises a pixel connection portion disposed at a side of the pixel base portion close to the gate line and connected with a drain electrode of the thin film transistor through at least a via hole; a first distance between an edge of the pixel connection portion at a side close to the common connection portion and an edge of the common connection portion at a side close to the pixel connection portion is between 20 μm and 50 μm, and the first distance is a dimension in the first direction.

8. The array substrate according to claim 6, wherein the common electrode in at least one sub-pixel further comprises a common shielding portion, and the common shielding portion of a present sub-pixel is connected with common base portions in a next row of sub-pixels through the common connection portion.

9. The array substrate according to claim 6, wherein there is a second distance between an edge of the common base portion in a present sub-pixel at a side away from a previous row of sub-pixels and an edge of the gate line in the previous row of sub-pixels at a side close to the present sub-pixel, there is a third distance between an end of the pixel strip electrode close to the common base portion and an edge of the common base portion close to the pixel strip electrode, the second distance is greater than the third distance, the second distance and the third distance are dimensions in the second direction.

10. The array substrate according to claim 9, wherein the second distance is 5 μm to 7 μm.

11. The array substrate according to claim 9, wherein the third distance is 3.5 μm to 4.5 μm.

12. The array substrate according to claim 6, wherein a fourth distance between an end of the pixel pectination portion in a present sub-pixel close to the gate line in a previous row of sub-pixels and an edge of the gate line in the previous row at a side close to the pixel pectination portion in the present sub-pixel is 9.0 μm to 11.5 μm.

13. The array substrate according to claim 1, wherein the array substrate further comprises a black matrix shielding region, and an orthographic projection of the black matrix shielding region on the base substrate contains an orthographic projection of the gate lines and the data lines on the base substrate; in the second direction, a fifth distance between a first edge of the black matrix shielding region at a side close to the gate line and an edge of the gate line at a side close to the first edge is 5 μm to 7 μm.

14. The array substrate according to claim 1, wherein at least one sub-pixel further comprises a common electrode line extending along the first direction, and the common electrode is connected with the common electrode line through at least a via hole.

15. The array substrate according to claim 14, wherein at least one sub-pixel further comprises a common connection line extending along the second direction, and the common electrode is simultaneously connected with the common electrode line and the common connection line through at least a via hole.

16. The array substrate according to claim 14, wherein at least one sub-pixel further comprises at least one shielding line, and a first end of the shielding line is connected with the common electrode line, and a second end of the shielding line is extended in a direction away from the common electrode line.

17. The array substrate according to claim 1, wherein at least one sub-pixel further comprises a gate connection line extending along the second direction, and the gate connection line is connected with the gate line.

18. The array substrate according to claim 17, wherein at least one sub-pixel further comprises a gate connection electrode connected with the gate connection line and the gate line through at least a via hole, respectively.

19. A display apparatus, comprising a first substrate and a second substrate oppositely arranged, wherein the first substrate comprises the array substrate according to claim 1, the second substrate comprises at least a black matrix, an orthographic projection of the black matrix on the base substrate contains an orthographic projection of the gate lines and data lines on the base substrate; in the second direction, a fifth distance between a first edge of the black matrix at a side close to the gate line and an edge of the gate line at a side close to the first edge is 5 µm to 7 µm.

20. A method for manufacturing an array substrate, comprising:

forming a plurality of gate lines and a plurality of data lines on a base substrate, wherein the plurality of gate lines are extended along a first direction and are sequentially arranged in a second direction, the plurality of data lines are extended along the second direction and are sequentially arranged in the first direction, the plurality of gate lines and the plurality of data lines are intersected to define a plurality of sub-pixels, each sub-pixel at least comprises a thin film transistor, the first direction is intersected with the second direction; and forming a pixel electrode and a common electrode, wherein the common electrode in at least one sub-pixel is connected with the common electrode in an adjacent sub-pixel in the second direction through a common connection portion, there is a first overlapped region between an orthographic projection of the common connection portion on the base substrate and an orthographic projection of a gate line on the base substrate, the first overlapped region has a first width in the first direction and a second width in the second direction, and the first width is less than the second width;

wherein the common electrode in at least one sub-pixel at least comprises a common base portion and a common pectination portion, the common pectination portion comprises a plurality of common strip electrodes, an orthographic projection of the common base portion on the base substrate overlaps with an orthographic projection of a gate line on the base substrate.

* * * * *